(12) United States Patent
Kowkutla et al.

(10) Patent No.: US 10,734,993 B2
(45) Date of Patent: Aug. 4, 2020

(54) ADAPTIVE VOLTAGE SCALING SYSTEM FOR OUT OF CONTEXT FUNCTIONAL SAFETY SOC

(71) Applicant: TEXAS INSTRUMENTS INCORPORATED, Dallas, TX (US)

(72) Inventors: Venkateswar Reddy Kowkutla, Allen, TX (US); Chunhua Hu, Plano, TX (US); Erkan Bilhan, Dallas, TX (US); Sumant Dinkar Kale, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/393,513

(22) Filed: Dec. 29, 2016

(65) Prior Publication Data

US 2018/0191343 A1 Jul. 5, 2018

(51) Int. Cl.
*G05B 19/042* (2006.01)
*G06F 1/24* (2006.01)
*G06F 1/3296* (2019.01)
*H03K 17/22* (2006.01)
*H03K 17/30* (2006.01)

(52) U.S. Cl.
CPC ........... *H03K 17/22* (2013.01); *G05B 19/042* (2013.01); *G06F 1/24* (2013.01); *G06F 1/3296* (2013.01); *G05B 2219/21119* (2013.01); *H03K 17/30* (2013.01)

(58) Field of Classification Search
CPC ...... H03K 17/22; H03K 17/223; H03K 17/24; H03K 2017/226; H03K 17/30; H03K 17/302; H03K 17/305; G05B 19/042; G05B 19/0421; G05B 19/0423; G05B 19/0425; G05B 19/0426; G05B 2219/21119
USPC ........................................................ 327/143
See application file for complete search history.

(56) References Cited

U.S. PATENT DOCUMENTS

| | | | | |
|---|---|---|---|---|
| 9,329,210 B1* | 5/2016 | Gupta | ................ | G01R 19/1659 |
| 2014/0256450 A1* | 9/2014 | Bleich | ................ | G07F 17/3202 463/43 |
| 2015/0378374 A1* | 12/2015 | Arnold | ................ | G05F 1/46 323/281 |
| 2018/0013418 A1* | 1/2018 | Srinivasan | ........... | H03K 17/223 |

* cited by examiner

*Primary Examiner* — Patrick C Chen
(74) *Attorney, Agent, or Firm* — Michelle F. Murray; Charles A. Brill; Frank D. Cimino

(57) ABSTRACT

The optimal operating voltage of a complex SoC may be influenced by process variations. The operating voltages may be dynamically adjusted for optimal performance. These adjustments require a dynamic reconfiguration of the voltage monitoring thresholds in the power on reset circuitry of the SoC.

18 Claims, 4 Drawing Sheets

ADAPTIVE VOLTAGE SCALING SYSTEM FOR OUT OF CONTEXT FUNCTIONAL SAFETY SOC

TECHNICAL FIELD OF THE INVENTION

The technical field of this invention is reset signal generation.

BACKGROUND OF THE INVENTION

A functional safety system often requires implementing voltage detectors and supervisory functions for a complex System on a Chip (SoC) in a larger system. Implementing those functions outside of the SoC not only increases the overall system cost, it also lacks the critical features to achieve high level functional safety standard specified by ISO 2626 and IEC 61508.

SUMMARY OF THE INVENTION

In order to design a complex SoC to achieve out of context functional safety features, embedded circuitry is required to generate an internal system reset with built in redundancy. Furthermore, the SoC also needs to comprehend the impact of external reset signals to make sure the device can enter a safe state when a fault occurs.

A fully integrated method is shown for generating a power on Reset on an SoC. Continuous voltage monitoring with integrated supervisory functions and reset sequencing is implemented, with redundant, multi stage voltage monitoring.

The optimum operating voltage of a complex SoC may be influenced by process variations. The voltages may be dynamically adjusted for optimal performance.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
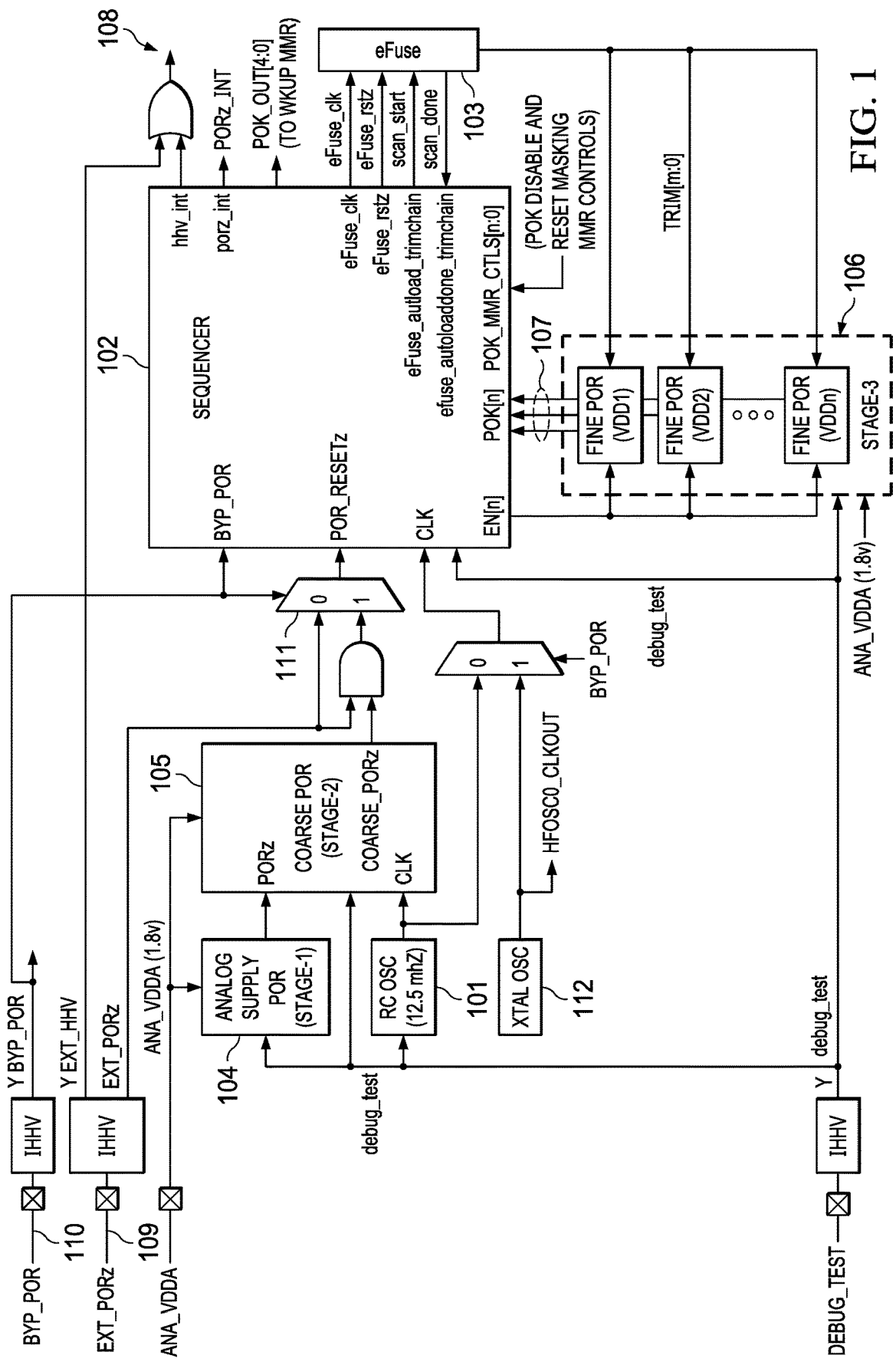
FIG. 1 shows a high level diagram of the reset circuit.

A fully integrated power on reset generation circuitry which can provide continuous voltage monitoring and reset sequencing is shown in FIG. 1. It incorporates control features such as redundancy and diagnostic capabilities which are critical to implement the functional safety feature.

The apparatus includes internal oscillators, a plurality of voltage detection stages and a power on reset (PoR) sequencer.

The internal RC oscillator 101 and crystal oscillator 112 are used to generate the clocks required by the power on reset (PoR) sequencer 102 and eFuse module 103. The outputs of voltage monitors 104, 105 and 106 are passed through deglitching circuits to filter out false signals such as glitches and noise from the analog sensors.

The first stage voltage detection circuit 104 is an analog power supply level detector—this is to ensure that the voltage has reached a threshold level at which analog circuits can safely and reliably operate. The second stage voltage detection circuit 105 is a coarse level detector on analog voltage rails and some critical digital voltage rails, which are required for fine tuning analog sensors for process and temperature variations. The third stage voltage detection circuit 106 is a plurality of more accurate level detectors, which ensures that all voltage rails are operating within specified limits. The circuits implemented in first and second stage do not require any trim values to fine tune the analog circuits for process and temperature variation compensations. The first stage voltage detection circuit 104 controls the reset to the second stage voltage detection circuit 105, and second stage controls the reset to the third stage voltage detection circuit 106. Final master reset signal 108 to the SoC will be a combined version of resets from all 3 stages. This ensures that the device will always receive a reset even if one of the stages is defective therefore providing the required redundancy needed for safety critical applications.

Once the voltage levels are valid, the second stage voltage detection circuit 105 releases reset to only a small portion of the device which enables the device to initiate the eFuse scanning. The eFuse block 103 contain analog trim values for the voltage detection circuits implemented in the third stage voltage detection circuit 106 for accurate voltage level monitoring. The third stage holds the reset to the designated voltage domains until it detects proper voltage levels on the rails.

After the eFuse scanning in eFuse block 103 is complete, the power on reset (PoR) sequencer 102 applies the trim values read out from the eFuse block 103 to the analog circuits for the voltage monitors in the third stage voltage detection circuit 106. The sequencer then enables the voltage monitors for accurate detection of voltage levels on the rails. The sequencer then waits for a power OK (POK) signal 107 response from each individual detector circuit. When all the voltage monitors indicate power OK on the rails, power on reset sequencer 102 waits for all IOs and clock oscillators in the device to stabilize and then de-asserts the reset signal 108 to the designated voltage domain.

Provision is made for external reset signals 109 and 110 that will override the internally generated resets when selected by selector 111.

All reset signals are properly level shifted to the destination voltage level with appropriate pull-up or pull-down functions. This is to ensure that if the source voltage dies, the reset signal is still at an appropriate level to put the destination voltage domain in the reset state.

Figure 2:
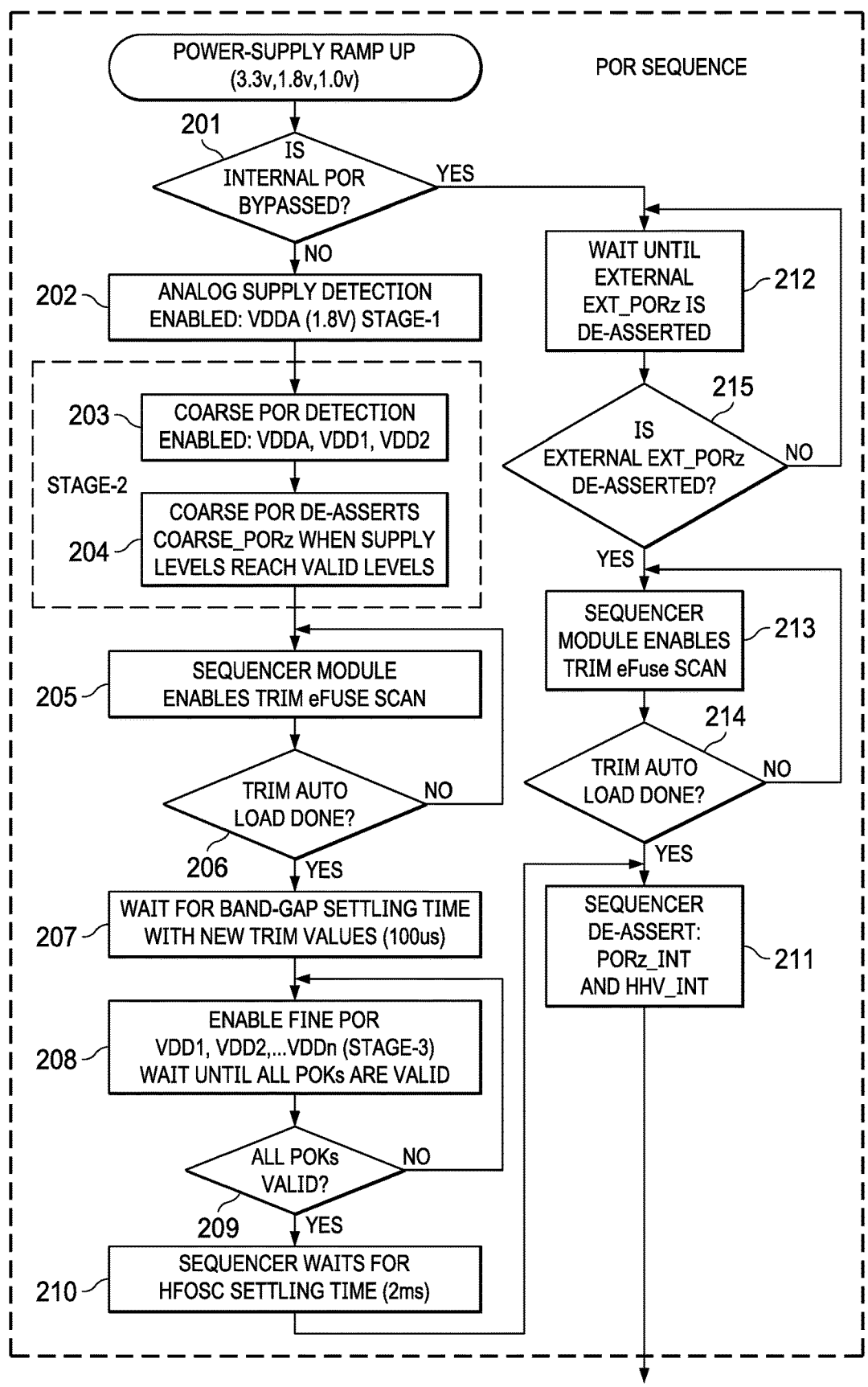
FIG. 2 is a flow chart of the reset function.

FIG. 2 shows the steps involved in the reset generation. Block 201 determines if the external PoR is asserted, and internal PoR bypassed. If not, analog power supply detection is enabled in block 202, followed by coarse PoR detection enabled in block 203. When power supply voltage levels reach valid levels, coarse PoR is deasserted in block 204. The sequencer module now enables the trim eFuse scan in block 205. When completion of the scan is determined, and the trim autoload is done, in block 206, a settling time is introduced in block 207, to wait for band-gap settling time with new trim values (100 us). After the settling time, the fine corrected power on reset signals are enabled in block 208. When all POK (Power OK) signals are valid as determined in block 209, an oscillator settling time is introduced, and the sequencer waits for HFOSC settling time (2 ms) in block 210, followed by the deassertion of the PoR signals by the sequencer in block 211.

If an external power on reset signal is detected in block 201, and internal PoR is bypassed, block 212 introduces a wait until the external power on reset signal is deasserted.

Once the external power on reset signal is deasserted in block 215, the trim eFuse scan is enabled by the sequencer in block 213. Once trim auto load is completed in block 214, flow returns to block 211.

Adaptive Voltage Scaling (AVS) provides mechanism to dynamically adjust voltage settings for a given voltage domain for Process and Temperature variations. To improve performance certain processor/core voltage levels may be overdriven to higher voltages than nominal levels. In lower power modes, these same voltages may be lowered to reduce leakage. However, the voltage monitor's thresholds are set based on nominal voltage at power up stage. To accurately monitor new voltage levels after applying Adaptive Voltage Scaling, the voltage monitoring circuit's thresholds have to be reprogrammed to reflect the voltage changes. This invention provides an apparatus and method to allow re-configuration of the threshold settings which aligns with the new operating voltages for an out of context functional safety SoC.

To support Adaptive Voltage Scaling (AVS) and new operating voltages, the solution shown allows a safe sequence and circuitry to change the voltage monitor circuit thresholds to correspond to the new settings.

Figure 3:
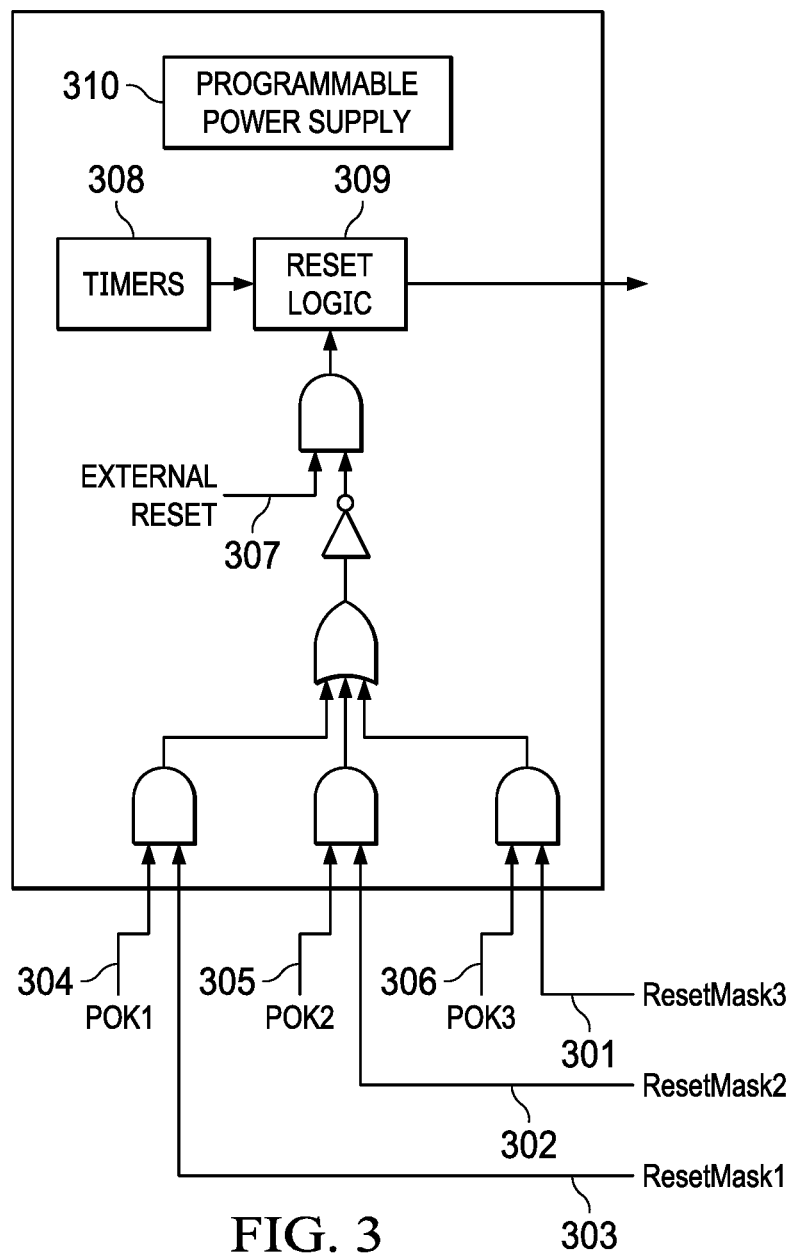
FIG. 3 shows an implementation of the power OK masking circuitry.

Prior to re-configuring the new threshold, the power OK signal coming out of that particular voltage monitor circuit must be masked as shown in FIG. 3. This ensures that any glitches coming out of voltage monitor are masked during reconfiguration of the threshold settings. Power OK signals 304, 305 and 306 are masked by reset masks 301, 302 and 303. The masked power OK signals are combined with external reset signal 307, and the final reset signal is generates by reset logic block 309. Timer block 308 is used by reset logic block 309 to implement settling times during the reconfiguration process as required.

Figure 4:
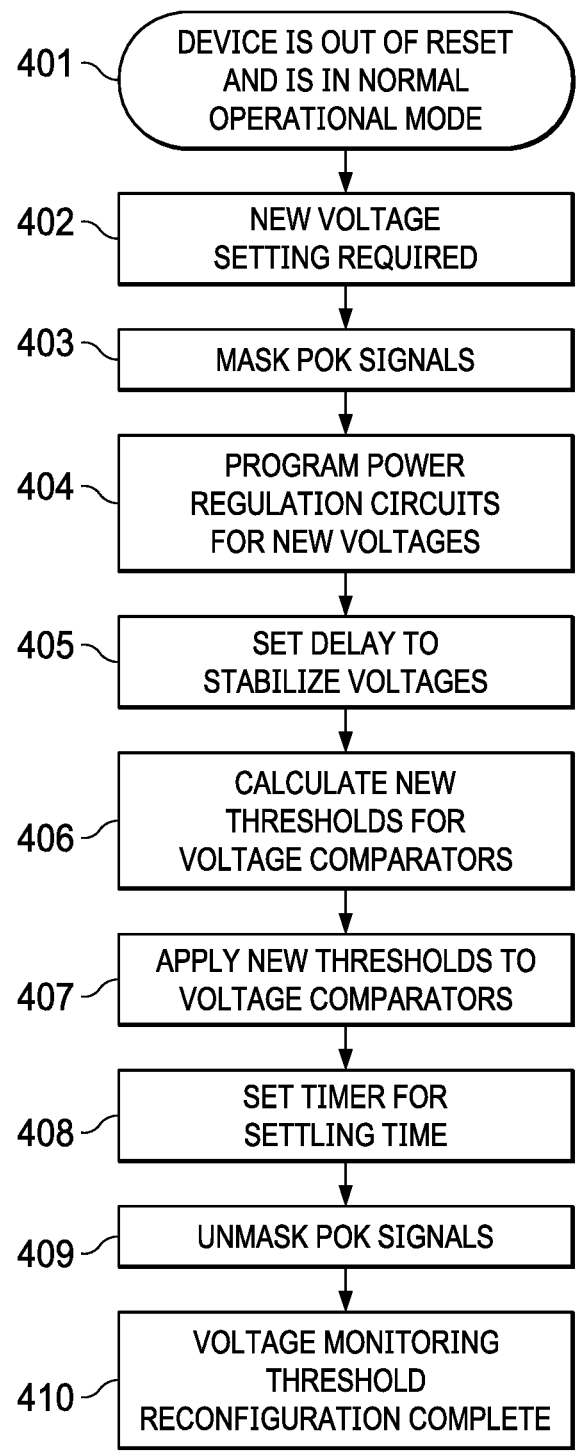
FIG. 4 shows a flow chart of the steps involved in the adaptive voltage scaling.

FIG. 4 demonstrates the steps employed to implement the threshold changes. The reconfiguration starts at block 401 with the device out of reset in the normal operating mode. When a new voltage setting is required in block 402, the power OK signals are masked in block 403. The power regulating circuits in programmable power supply 310 are programmed to the new voltage requirements in block 404. A delay is set in block 405 to allow the new voltages to stabilize, and the new voltage thresholds for the voltage comparators is calculated in block 406, and are applied to the voltage comparators in block 407. A settling time is applied in block 408, by setting a timer, followed by unmasking of the power OK signals in block 409. As shown in block 410, this completes the voltage monitoring threshold reconfiguration process.

What is claimed is:

1. A power on reset (PoR) sequencer, comprising:
   a first logical gate configured to mask a first power OK (POK) signal with a first reset mask, to generate a first masked signal;
   a second logical gate configured to mask a second POK signal with a second reset mask, to generate a second masked signal;
   a third logical gate coupled to the first logical gate and to the second logical gate, the third logical gate configured to take a logical OR operation of the first masked signal and the second masked signal, to generate a control signal; and
   a reset logic configured to:
      calculate new thresholds for a voltage monitoring circuit based on the control signal; and
      apply the new thresholds for the voltage monitoring circuit to the voltage monitoring circuit.

2. The PoR sequencer of claim 1, further comprising a timer configured to cause reset logic to wait a delay after determining that a new voltage setting is required before applying the new thresholds.

3. The PoR sequencer of claim 2, further comprising a programmable power supply programmed to the new voltage setting.

4. The PoR sequencer of claim 1, wherein the first logical gate is configured to unmask the first POK signal with the first reset mask, at least a settling time after the reset logic applies the new thresholds for the voltage monitoring circuit.

5. The PoR sequencer of claim 4, further comprising a timer configured to cause the first logical gate to wait the settling time after the reset logic applies the new thresholds for the voltage monitoring circuit to unmask the first POK signal.

6. The PoR sequencer of claim 4, wherein the second logical gate is furthered configured to:
   unmask the second POK signal with the second reset mask, at least the settling time after the reset logic applies the new thresholds for the voltage monitoring circuit.

7. The PoR sequencer of claim 6, further comprising: comprising a fourth logical gate configured to:
   mask a third POK signal with a third reset mask, to generate a third masked signal; and
   unmask the third POK signal with the third reset mask, at least the settling time after the reset logic applies the new thresholds for the voltage monitoring circuit.

8. The PoR sequencer of claim 7 wherein the fourth logical gate is coupled the third logical gate, the third logical gate configured to take a logical OR operation of the first masked signal, the second masked signal, and the third masked signal, to generate the control signal.

9. The PoR sequencer of claim 1, further comprising a logical operator configured to mask the first masked signal with an external reset signal, to generate the control signal for the reset logic.

10. A method comprising:
    masking, by a first logical gate, a first power OK (POK) signal with a first reset mask, to generate a first masked signal;
    masking, by a second logical gate, a second POK signal with a second reset mask, to generate a second masked signal;
    taking a logical OR operation, by a third logical gate, of the first masked signal and the second masked signal, to generate a control signal;
    calculating, by a reset logic, new thresholds for a voltage monitoring circuit, based on the control signal; and
    applying, by the reset logic to the voltage monitoring circuit, the new thresholds.

11. The method of claim 10, further comprising causing, by a timer, the reset logic to wait a delay after determining that a new voltage setting is required before applying the new thresholds.

12. The method of claim 11, further comprising programming a programmable power supply to the new voltage setting.

13. The method of claim 10, further comprising unmasking, by the first logical gate, the first POK signal with the first reset mask, at least a settling time after the reset logic applies the new thresholds for the voltage monitoring circuit.

14. The method of claim 13, further comprising causing, by a timer, the first logical gate to wait the settling time after the reset logic applies the new thresholds for the voltage monitoring circuit to unmask the first POK signal.

15. The method of claim 13, further comprising:
unmasking, by the second POK signal with the second reset mask, at least the settling time after the reset logic applies the new thresholds for the voltage monitoring circuit.

16. The method of claim 15, further comprising:
masking, by a fourth logical gate, a third POK signal with a third reset mask, to generate a third masked signal; and
unmasking, by the fourth logical gate, the third POK signal with the second reset mask, at least the settling time after the reset logic applies the new thresholds for the voltage monitoring circuit.

17. The method of claim 16, further comprising taking a logical OR operation, by the third logical gate, of the first masked signal, the second masked signal, and the third masked signal, to generate the control signal.

18. The method of claim 10, further comprising masking, by a logical operator, the first masked signal with an external reset signal, to generate the control signal.

* * * * *